United States Patent
Chang et al.

(10) Patent No.: US 10,984,885 B2
(45) Date of Patent: Apr. 20, 2021

(54) MEMORY TEST ARRAY AND TEST METHOD THEREOF

(71) Applicants: Jiangsu Advanced Memory Technology Co., Ltd., Jiangsu (CN); Jiangsu Advanced Memory Semiconductor Co., Ltd., Jiangsu (CN)

(72) Inventors: Hsiung-Shih Chang, Hsinchu County (TW); Yu-Cheng Liao, Hsinchu County (TW); Meng-Hsueh Tsai, Hsinchu County (TW)

(73) Assignees: Jiangsu Advanced Memory Technology Co., Ltd., Jiangsu (CN); Jiangsu Advanced Memory Semiconductor Co., Ltd., Jiangsu (CN)

( * ) Notice: Subject to any disclaimer, the term of this patent is extended or adjusted under 35 U.S.C. 154(b) by 0 days.

(21) Appl. No.: 16/517,690

(22) Filed: Jul. 22, 2019

(65) Prior Publication Data
US 2020/0312421 A1    Oct. 1, 2020

(30) Foreign Application Priority Data
Apr. 1, 2019   (CN) .......................... 201910257457.3

(51) Int. Cl.
G11C 29/00     (2006.01)
G11C 29/50     (2006.01)
G11C 13/00     (2006.01)

(52) U.S. Cl.
CPC .... G11C 29/50012 (2013.01); G11C 13/0004 (2013.01); *G11C 2213/79* (2013.01)

(58) Field of Classification Search
CPC .......... G11C 29/50012; G11C 13/0004; G11C 2213/79
USPC .................................................. 365/201, 163
See application file for complete search history.

(56) References Cited

U.S. PATENT DOCUMENTS

| | | | |
|---|---|---|---|
| 2005/0201134 A1* | 9/2005 | Hartmann | H01L 24/06 365/63 |
| 2009/0184389 A1* | 7/2009 | Bertin | H01L 29/068 257/476 |

FOREIGN PATENT DOCUMENTS

CN       204791991 U      11/2015

* cited by examiner

*Primary Examiner* — Huan Hoang
(74) *Attorney, Agent, or Firm* — CKC & Partners Co., LLC (57) ABSTRACT

A memory test array and a test method thereof are provided. The memory test array includes a first memory array, a second memory array, and a plurality of first common conductive pads. The first memory array includes a plurality of first bit lines and a plurality of first word lines. The second memory array is adjacent to the first memory array and includes a plurality of second bit lines and a plurality of second word lines. Each of the first common conductive pads has a first end and a second end, and the first ends and the second ends are respectively coupled to the first bit lines and the second bit lines, or respectively coupled to the first word lines and the second word lines. The memory test array of the present disclosure can effectively save the area of the memory test chip and make the test process more efficient.

11 Claims, 7 Drawing Sheets

MEMORY TEST ARRAY AND TEST METHOD THEREOF

CROSS-REFERENCE TO RELATED APPLICATION

This application claims priority to China Application Serial Number 201910257457.3, filed Apr. 1, 2019, which is herein incorporated by reference.

BACKGROUND

Field of Invention

The present disclosure relates to a memory test array and a test method thereof.

Description of Related Art

Memory is a semiconductor element used to store data. It may be divided into non-volatile memory and volatile memory. With the rapid development of technology, the industry's demand for memory has gradually increased, such as high reliability, high endurance, fast storage speed and large capacity. Therefore, the semiconductor industry continues to strive to develop various technologies to reduce component size and increase element density of the memory.

Figure 1A:
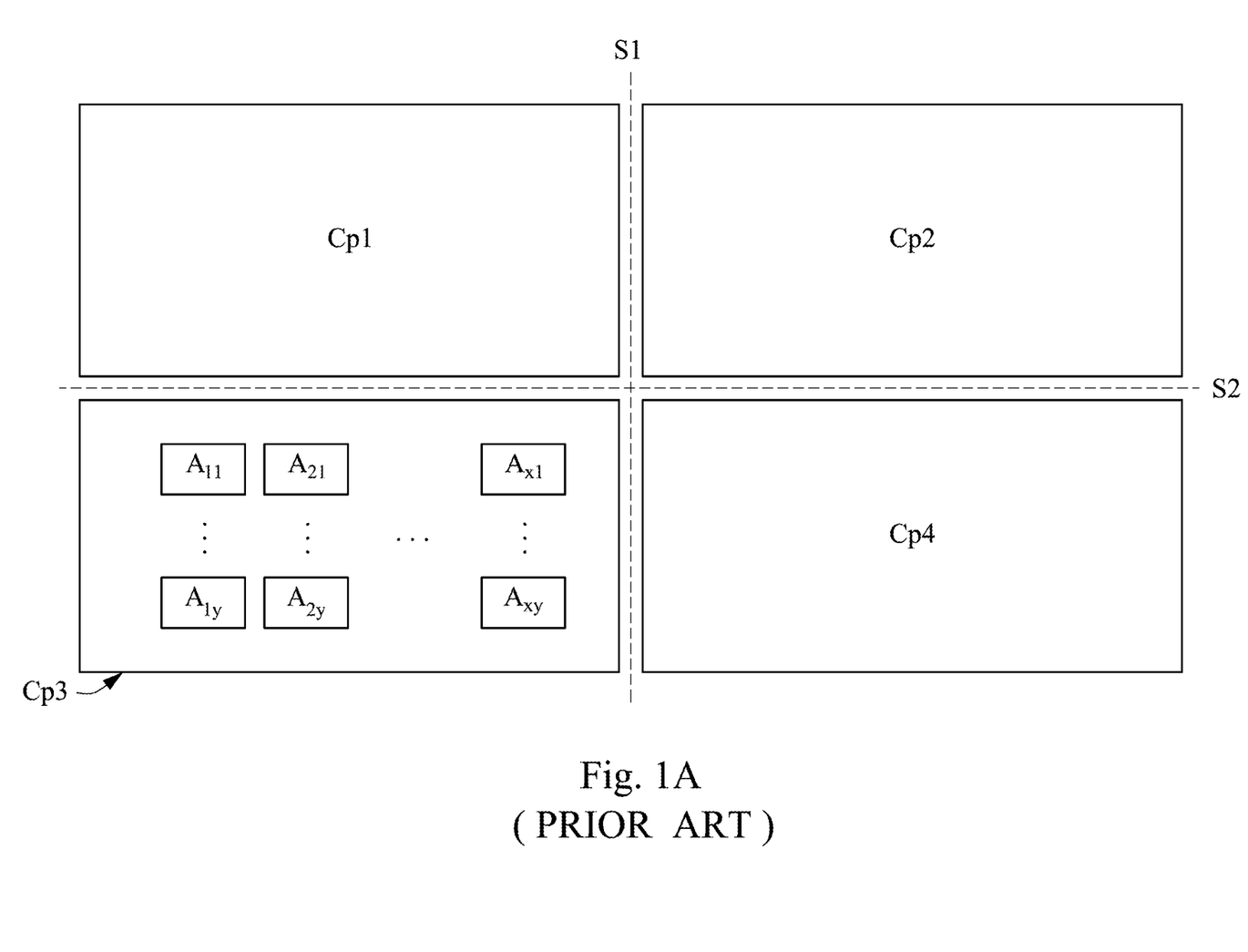
FIG. 1A is a top view of prior art of memory product chips and a test chip.

In the prior art, as shown in FIG. 1A, one wafer includes a plurality of standard memory product chips Cp1, Cp2, and Cp4. At least one test chip, such as a test chip Cp3, is disposed in the wafer to further understand characteristics of memory elements in the memory chip. The test chip Cp3 includes a plurality of memory test arrays A11, Ax1, A1y, Axy, and the like.

Figure 1B:
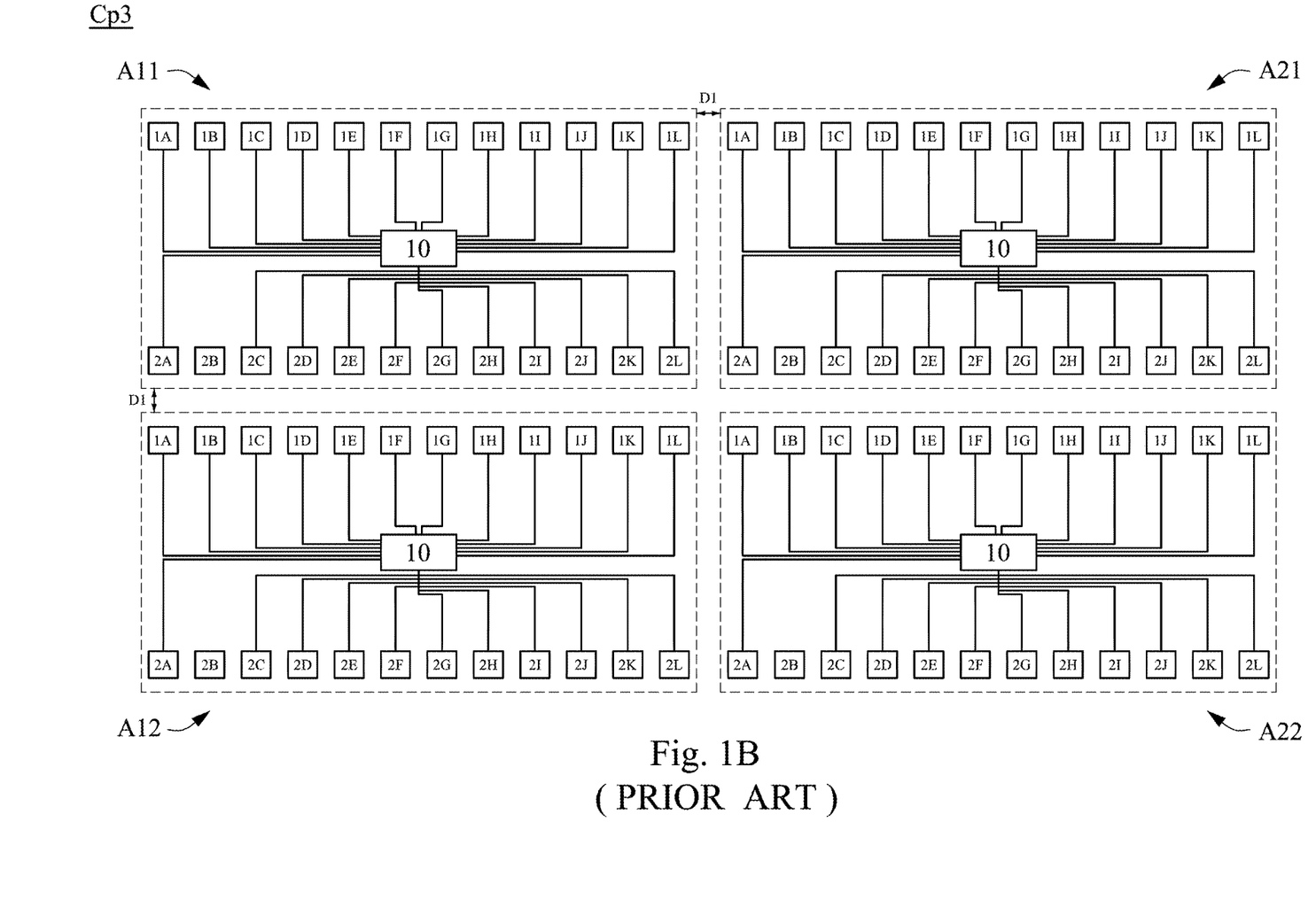
FIG. 1B is a partial enlarged view of the memory test chip of FIG. 1A.

FIG. 1B is a partial enlarged view of the memory test chip Cp3 of FIG. 1A. As shown in FIG. 1B, each of the memory test arrays A11, A12, A21, A22 includes a memory element array 10, and the memory element array 10 includes a plurality of memory elements. For example, each memory element array 10 may include 100 memory elements. Each memory element array 10 has its respective test pads, which can be accessed to each memory element in the memory element array 10 to verify characteristics of the memory elements. Taking a memory element array having 100 memory elements as an example, the test pad should include at least 10 word signal pads (e.g., conductive pads 1A-1L) and 10 bit signal pads (e.g., conductive pads 2A-2L) to access to 100 individual memory elements in the memory element array and to verify their characteristics.

In order to obtain more memory element data, more memory elements should be disposed in the test chip Cp3. Therefore, how to accommodate more memory elements in a limited space of the test chip Cp3 is one of the technical issues to be solved at present. In addition, in the prior art, measuring a large number of memory elements require a long testing time, so how to reduce the testing time to improve test efficiency is also a technical issue to be solved.

SUMMARY

According to various embodiments of the present disclosure, a memory test array is provided, which includes a first memory array, a second memory array, and a plurality of first common conductive pads. The first memory array includes a plurality of first bit lines and a plurality of first word lines. The second memory array is adjacent to the first memory array and includes a plurality of second bit lines and a plurality of second word lines. Each of the first common conductive pads has a first end and a second end, and the first ends and the second ends are respectively coupled to the first bit lines and the second bit lines, or respectively coupled to the first word lines and the second word lines.

According to some embodiments of the present disclosure, the first common conductive pads are disposed between the first memory array and the second memory array.

According to some embodiments of the present disclosure, the memory test array further includes a plurality of first conductive pads coupled to the first memory array and a plurality of second conductive pads coupled to the second memory array. The first conductive pads and the first common conductive pads are disposed at two opposite sides of the first memory array, and the second conductive pads and the first common conductive pads are disposed at two opposite sides of the second memory array.

According to some embodiments of the present disclosure, the first conductive pads are coupled to the first word lines, and the first common conductive pads are coupled to the first bit lines and the second bit lines, and the second conductive pads are coupled to the second word lines.

According to some embodiments of the present disclosure, the first conductive pads are coupled to the first bit lines, and the first common conductive pads are coupled to the first word lines and second word lines, and the second conductive pads are coupled to the second bit lines.

According to some embodiments of the present disclosure, the memory test array further includes a third memory array and a plurality of second common conductive pads. The third memory array is adjacent to the second memory array and includes a plurality of third bit lines and a plurality of third word lines. The plurality of second common conductive pads are disposed between the second memory array and the third memory array, in which each of the second common conductive pads has a first end and a second end, and the first ends and the second ends are respectively coupled to the second bit lines and the third bit lines, or respectively coupled to the second word lines and the third word lines.

According to some embodiments of the present disclosure, the memory test array further includes a plurality of first conductive pads and a plurality of third conductive pads. The first conductive pads are coupled to the first memory array, and the first conductive pads and the first common conductive pads are disposed at two opposite sides of the first memory array. The third conductive pads are coupled to the third memory array, and the third conductive pads and the second common conductive pads are disposed at two opposite sides of the third memory array.

According to some embodiments of the present disclosure, the first conductive pads are coupled to the first word lines, and the third conductive pads are coupled to the third bit lines, and the first common conductive pads are coupled to the first bit lines and the second bit lines, and the second common conductive pads are coupled to the second word lines and the third word lines.

According to some embodiments of the present disclosure, the first conductive pads are coupled to the first bit lines, and the third conductive pads are coupled to the third word lines, and the first common conductive pads are coupled to the first word lines and the second word lines, and the second common conductive pads are coupled to the second bit lines and the third bit lines.

According to various embodiments of the present disclosure, a memory test array is provided, which includes a first memory array and a second memory array. The first memory array includes a plurality of first bit contact pads and a plurality of first word contact pads. The second memory array includes a plurality of second bit contact pads and a plurality of second word contact pads. The first bit contact pads are shared with the second bit contact pads, or the first word contact pads are shared with the second word contact pads.

According to various embodiments of the present disclosure, a method of testing a memory test array is provided, which includes providing the above memory test array; using a probe card including at least three rows of parallel probes, the at least three rows of parallel probes respectively in contact with the first conductive pads, the first common conductive pads and the second conductive pads. Thereafter, a first electrical signal is controlled and transmitted to the first conductive pads and the first common conductive pads through a test software to test the first memory array. Thereafter, a second electrical signal is controlled and transmitted to the second conductive pads and the first common conductive pads through the test software to test the second memory array.

According to some embodiments of the present disclosure, a test time of the first electrical signal and a test time of the second electrical signal on a time axis are not overlapped.

According to various embodiments of the present disclosure, a method of testing a memory test array is provided, which includes after providing the above memory test array, using a probe card including at least four rows of parallel probes, the at least four rows of parallel probes respectively in contact with the first conductive pads, the first common conductive pads, the second common conductive pads, and the third conductive pads. A first electrical signal is then controlled and transmitted to the first conductive pads and the first common conductive pads through a test software to test the first memory array. The second electrical signal is then controlled and transmitted to the first common conductive pads and the second common conductive pads through the test software to test the second memory array. Thereafter, a third electrical signal is controlled and transmitted to the second common conductive pads and the third conductive pads through the test software to test the third memory array.

According to some embodiments of the present disclosure, a test time of the first electrical signal, a test time of the second electrical signal, and a test time of the third electrical signal on a time axis are not overlapped.

BRIEF DESCRIPTION OF THE DRAWINGS

The various aspects of the present disclosure may be better understood from the following detailed description and the figures. It should be noted that, in accordance with standard practice in the industry, various features are not drawn to scale. In fact, the dimensions of various features may be arbitrarily increased or decreased to make the description clear.

DETAILED DESCRIPTION

Various embodiments of the present disclosure are disclosed in the drawings. For clarity, many practical details will be explained in the following description. However, it should be understood that these practical details are not intended to limit the present disclosure. That is, in some embodiments of the present disclosure, these practical details are not necessary. For clarity, the size or thickness of the element may be exaggerated and not plotted in the original size. In addition, some of the conventional structures and elements are shown in the drawings in a simplified schematic manner in order to simplify the drawings.

Spatially relative terms, such as "beneath," "below," "over," "on," and the like, may be used herein for ease to describe one element or feature's relationship to another element(s) or feature(s) as illustrated in the figures. The true meaning of the spatially relative terms includes other orientations. For example, when the figure is flipped up and down by 180 degrees, the relationship between one element and another element may change from "beneath," "below," to "over," "on." In addition, the spatially relative descriptions used herein should be interpreted the same.

Figure 2:
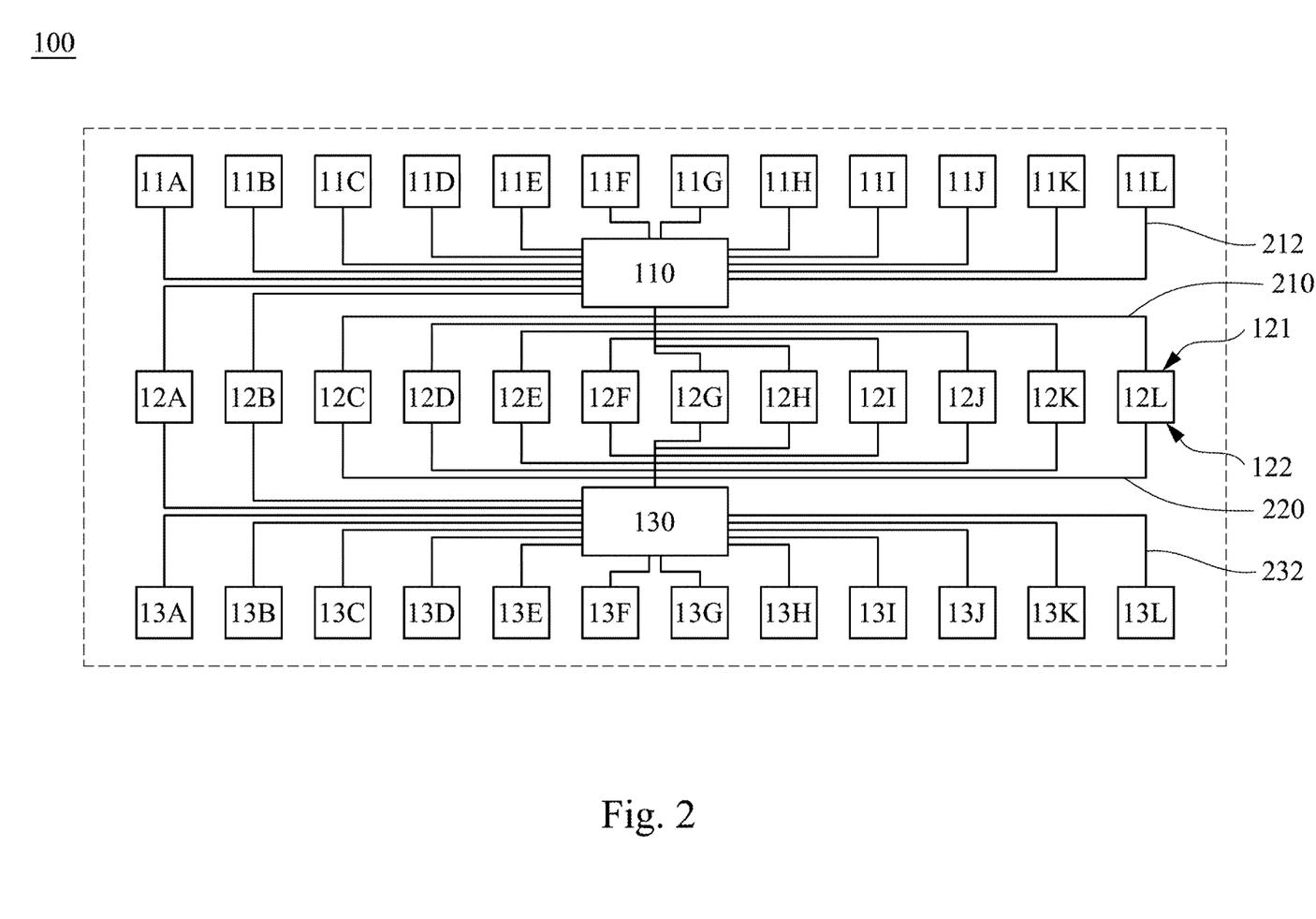
FIG. 2 is a schematic diagram of a memory test array according to some embodiments of the present disclosure.

FIG. 2 is a schematic diagram of a memory test array 100 according to some embodiments of the present disclosure. Referring to FIG. 2, the memory test array 100 includes a first memory array 110, a second memory array 130, and a plurality of first common conductive pads 12A-12L. The second memory array 130 is adjacent to the first memory array 110. In some embodiments, the plurality of first common conductive pads 12A-12L are disposed between the first memory array 110 and the second memory array 130. The memory arrays 110 and 130 may include a plurality of memory cells, and the memory cells are not limited to a specific memory, which may include a phase change memory (PCM), a magnetoresistive random access memory (MRAM), a resistive random access memory (RRAM), and the like. In other words, the concept of the present disclosure is not limited to the memory type. For convenience of explanation, the phase change memory is taken as an example below.

Figure 3A:
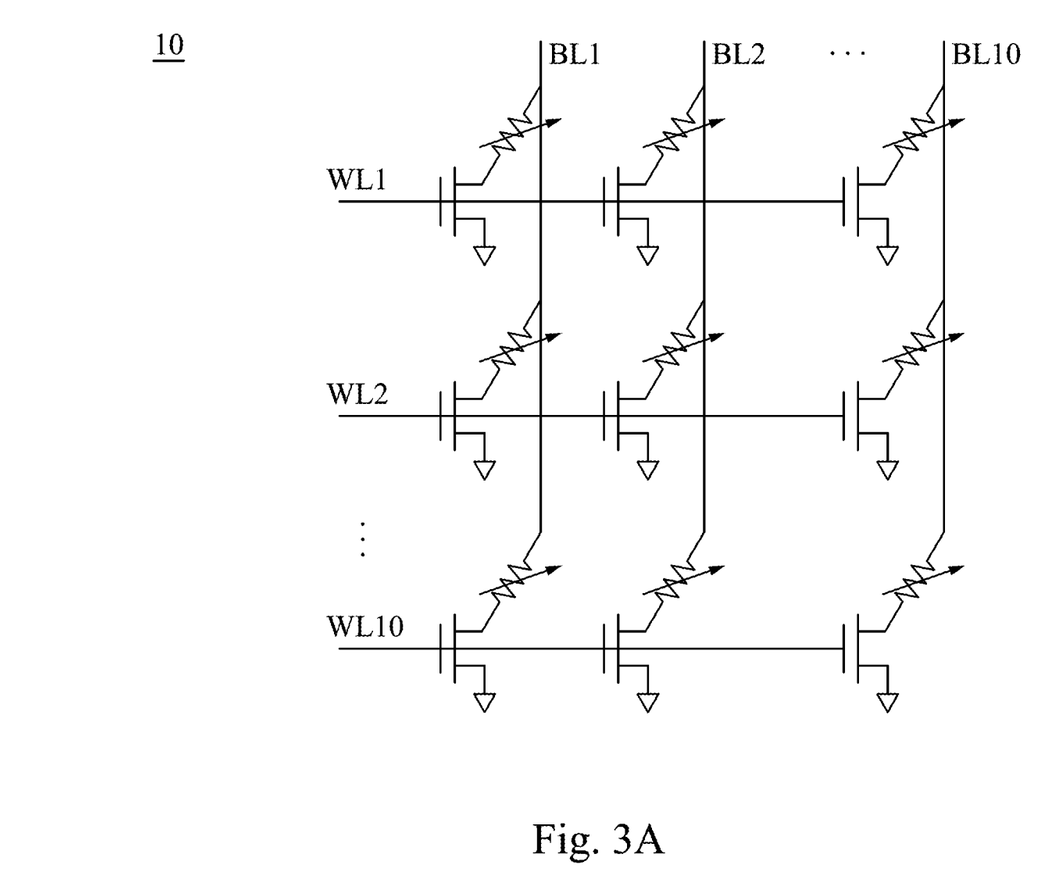
FIG. 3A is a schematic diagram of a phase change memory array according to some embodiments of the present disclosure.
Figure 3B:
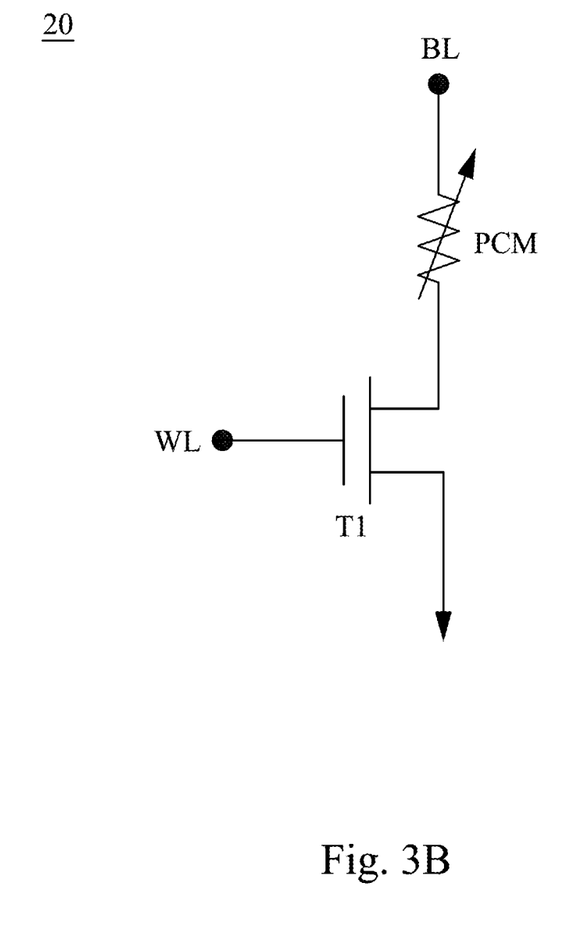
FIG. 3B is a schematic diagram of a phase change memory cell according to some embodiments of the present disclosure.

FIG. 3A is a schematic diagram of a phase change memory array according to some embodiments of the present disclosure. FIG. 3B is a schematic diagram of a phase change memory cell 20 according to some embodiments of the present disclosure. In some embodiments, the first memory array 110 may be a phase change memory array as shown in FIG. 3A. The first memory array 110 will be described below with reference to FIGS. 3A-3B.

Please refer to FIGS. 3A-3B. The first memory array 110 may include a plurality of phase change memory cells 20, a plurality of first bit lines BL (e.g., BL1-BL10), and a plurality of first word lines WL (e.g., WL1-WL10). Each of the phase change memory cells 20 is electrically connected to a corresponding one of the word lines WL and one of the bit lines BL. In some embodiments, the word line WL may be equipotentially connected to a word contact pad, and the bit line BL may be equipotentially connected to a bit contact pad. The phase change memory cell 20 may be any known phase change memory cell. As shown in FIG. 3B, the phase change memory cell 20 may include a transistor T1 and a phase change memory element PCM, in which the word line WL is connected to a gate of the transistor T1, and the phase change memory element PCM is connected to the bit line BL.

In some embodiments, the first memory array 110 may include a 10×10 array of the phase change memory, i.e., including 100 phase change memory cells 20. It should be understood that the phase change memory array shown in FIG. 3A is merely an example, and the present disclosure is not limited thereto. In other embodiments, the first memory array 110 may include any number of the phase change memory cells 20. In other embodiments, the first memory array 110 may also include any other types of memory arrays and a memory cells.

Please continue to refer to FIG. 2. In some embodiments, the second memory array 130 may be the same as or similar to the first memory array 110. In other words, in some embodiments, the second memory array 130 may be the phase change memory array shown in FIG. 3A, which includes a plurality of phase change memory cells 20, a plurality of second bit lines BL, and a plurality of second word lines WL. In more detail, the second memory array 130 may include the same number of memory cells, the same number of bit lines, and the same number of word lines as the first memory array 110. In other embodiments, the second memory array 130 may also be a memory array with another type.

The plurality of first common conductive pads 12A-12L respectively have first ends 121 and second ends 122. In some embodiments, the first end 121 may be coupled to the first bit line BL of the first memory array 110, and the second end 122 may be coupled to the second bit line BL of the second memory array 130. In other embodiments, the first end 121 may be coupled to the first word line WL of the first memory array 110, and the second end 122 may be coupled to the second word line WL of the second memory array 130. Specifically, in some embodiments, the first end 121 of the first common conductive pad 12L may be equipotentially connected to a corresponding one of the first bit lines BL in the first memory array 110 through a wire 210, and the second end 122 thereof may be equipotentially connected to a corresponding one of the second bit lines BL in the second memory array 130 through a wire 220. Alternatively, in other embodiments, the first end 121 of the first common conductive pad 12L may be equipotentially connected to a corresponding one of the first word lines WL in the first memory array 110 through the wire 210, and the second end 122 thereof may be equipotentially connected to a corresponding one of the second word lines WL in the second memory array 130 through the wire 220.

Please continue to refer to FIG. 2. In some embodiments, the memory test array 100 further includes a plurality of first conductive pads 11A-11L and a plurality of second conductive pads 13A-13L. As shown in FIG. 2, each of the first conductive pads 11A-11L is coupled to the first memory array 110, and the first conductive pads 11A-11L and the first common conductive pads 12A-12L are disposed at two opposite sides of the first memory array 110. Each of the second conductive pads 13A-13L is coupled to the second memory array 130, and the second conductive pads 13A-13L and the first common conductive pads 12A-12L are disposed at two opposite sides of the second memory array 130. In some embodiments, the first conductive pads 11A-11L may be coupled to the corresponding first word lines WL in the first memory array 110, and the first common conductive pads 12A-12L are coupled to the corresponding first bit lines BL in the first memory array 110 and the corresponding second bit lines BL in the second memory array 130, and the second conductive pads 13A-13L are coupled to the corresponding second word lines WL in the second memory array 130. In other embodiments, the first conductive pads 11A-11L may be coupled to the corresponding first bit lines BL in the first memory array 110, and the first common conductive pads 12A-12L are coupled to the corresponding first word lines WL in the first memory array 110 and the corresponding second word lines WL in the second memory array 130, and the second conductive pads 13A-13L are coupled to the corresponding second bit lines BL in the second memory array 130.

Specifically, each of the first bit lines BL in the first memory array 110 may be equipotentially connected to a corresponding one of the first conductive pads 11A-11L through a wire 212. For example, the first bit line BL10 may be equipotentially connected to the first conductive pad 11L. Each of the first word lines WL of the first memory array 110 may be equipotentially connected to the first end 121 of a corresponding one of the first common conductive pads 12A-12L through the wire 210. For example, the first word line WL10 is equipotentially connected to the first common conductive pad 12L.

Similarly, each of the second bit lines BL in the second memory array 130 may be equipotentially connected to a corresponding one of the second conductive pads 13A-13L through a wire 232. For example, the second bit line BL10 is equipotentially connected to the second conductive pad 13L. Each of the second word lines WL of the second memory array 130 may be equipotentially connected to the second end 122 of a corresponding one of the first common conductive pads 12A-12L through the wire 220. For example, the second word line WL10 is equipotentially connected to the first common conductive pad 12L. In other words, the first common conductive pads 12A-12L can simultaneously equipotentially connect the corresponding first word lines WL of the first memory array 110 and the corresponding second word lines WL of the second memory array 130. For example, the first common conductive pad 12L simultaneously equipotentially connects the first word line WL10 of the first memory array 110 and the second word line WL10 of the second memory array 130. In some embodiments, the memory test array 100 may also include other elements, such as a virtual common conductive pad.

In other embodiments, the first memory array 110 includes a plurality of first bit contact pads and a plurality of first word contact pads, and the second memory array 130 includes a plurality of second bit contact pads and a plurality of second word contact pads. In some embodiments, each of the first bit contact pads may be equipotentially connected to a corresponding one of the first bit lines BL1-BL10, and each of the first word contact pads may be equipotentially connected to a corresponding one of the first word lines WL1-WL10. In some embodiments, each of the second bit contact pads may be equipotentially connected to a corresponding one of the second bit lines BL1-BL10, and each of the second word contact pads may be equipotentially connected to a corresponding one of the second word lines WL1-WL10. In some embodiments, the first bit contact pads are shared with the second bit contact pads. In other embodiments, the first word contact pads are shared with the second word contact pads.

It should be noted that the number and size of the first conductive pads 11A-11L, the first common conductive pads 12A-12L, and the second conductive pads 13A-13L illustrated in FIG. 2 are merely examples, and the present disclosure is not limited thereto. The first conductive pads 11A-11L, the first common conductive pads 12A-12L, and the second conductive pads 13A-13L may be correspondingly disposed according to the number of the memory cells included in the first memory array 110 and the second memory array 130.

Figure 4:
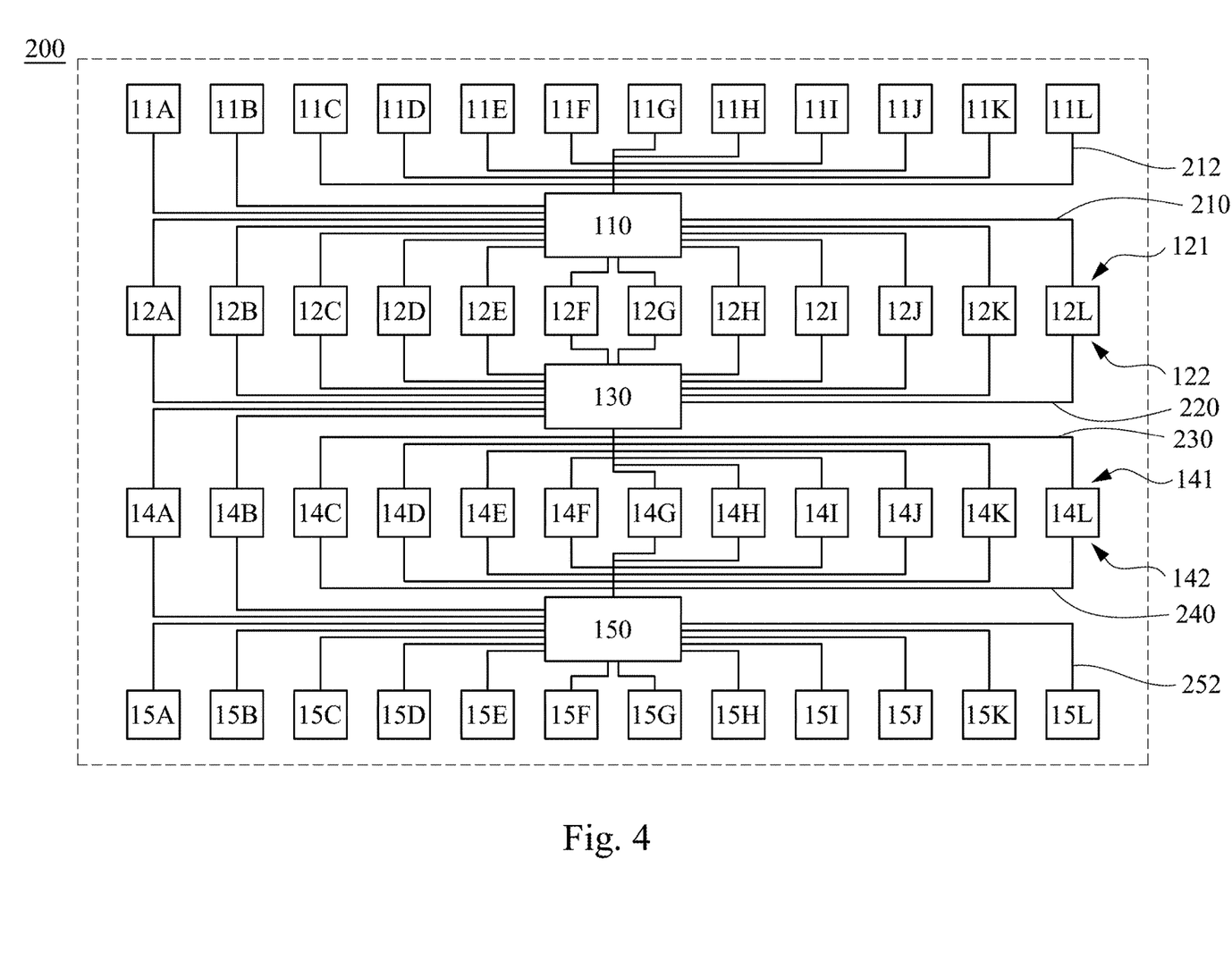
FIG. 4 is a schematic diagram of a memory test array according to some embodiments of the present disclosure.

FIG. 4 is a schematic diagram of a memory test array 200 according to some embodiments of the present disclosure. The elements of the memory test array 200 are same as or similar to those with the same reference numerals of the memory test array 100 shown in FIG. 2. Therefore, the first memory array 110, the first common conductive pads 12A-12L, and the second memory array 130 in the memory test array 200 and their connection relationships will not be described below. As shown in FIG. 4, the memory test array 200 further includes a third memory array 150 and second common conductive pads 14A-14L.

The third memory array 150 is adjacent to the second memory array 130. The third memory array 150 may be the same as or similar to the first memory array 110 and the second memory array 130. That is, in some embodiments, the third memory array 150 may be a phase change memory array as shown in FIG. 3A, which includes a plurality of phase change memory cells 20 (shown in FIG. 3B), and a plurality of third bit lines BL and a plurality of third word lines WL. In more detail, the third memory array 150 may include the same number of memory cells, the same number of bit lines, and the same number of word lines as the first memory array 110 and the second memory array 130. In other embodiments, the third memory array 150 may also be a memory array with another type.

As shown in FIG. 4, a plurality of second common conductive pads 14A-14L are disposed between the second memory array 130 and the third memory array 150, and each of the second common conductive pads 14A-14L has a first end 141 and a second end 142. In some embodiments, the first ends 141 of the second common conductive pads 14A-14L may be coupled to the second bit lines BL of the second memory array 130, and the second ends 142 may be coupled to the third bit lines BL of the third memory array 150. In other embodiments, the first ends 141 may be coupled to the second word lines WL of the second memory array 130, and the second ends 142 may be coupled to the third word lines WL of the third memory array 150.

Specifically, in some embodiments, the first ends 141 of the second common conductive pads 14A-14L may be equipotentially connected to the corresponding second bit lines BL of the second memory array 130 through wires 230, respectively, and the second ends 142 may be equipotentially connected to the corresponding third bit lines BL of the third memory array 150 through wires 240, respectively. Alternatively, in other embodiments, the first ends 141 of the second common conductive pads 14A-14L may be equipotentially connected to the corresponding second word lines WL of the second memory array 130 through the wires 230, respectively, and the second ends 142 may be equipotentially connected to the corresponding third word lines WL of the third memory array 150 through the wires 240, respectively.

Please continue to refer to FIG. 4. In some embodiments, the memory test array 200 further includes a plurality of first conductive pads 11A-11L and a plurality of third conductive pads 15A-15L. The first conductive pads 11A-11L and first common conductive pads 12A-12L are disposed at two opposite sides of the first memory array 110. The third conductive pads 15A-15L are coupled to the third memory array 150, and the third conductive pads 15A-15L and the second common conductive pads 14A-14L are disposed at two opposite sides of the third memory array 150.

In some embodiments, each of the first conductive pads 11A-11L may be equipotentially connected to a corresponding first word line WL of the first memory array 110 through a wire 212. Each of the first common conductive pads 12A-12L is equipotentially connected to a corresponding first bit line BL of the first memory array 110 through a wire 210, and is equipotentially connected to a corresponding second bit line BL of the second memory array 130 through a wire 220. Each of the second common conductive pads 14A-14L is equipotentially connected to a corresponding second word line WL of the second memory array 130 through the wire 230, and is equipotentially connected to a corresponding third word line WL of the third memory array 150 through the wire 240. Each of the third conductive pads 15A-15L is connected to a corresponding third bit line BL of the third memory array 150 through a wire 252.

In other embodiments, each of the first conductive pads 11A-11L may be equipotentially connected to a corresponding first bit line BL of the first memory array 110 through the wire 212. Each of the first common conductive pads 12A-12L is equipotentially connected to a corresponding first word line WL of the first memory array 110 through the wire 210, and is equipotentially connected to a corresponding second word line WL of the second memory array 130 through the wire 220. Each of the second common conductive pads 14A-14L is equipotentially connected to a corresponding second bit line BL of the second memory array 130 through the wire 230, and is equipotentially connected to a corresponding third bit line BL of the third memory array 150 through the wire 240. Each of the third conductive pads 15A-15L is equipotentially connected to a corresponding third word line WL of the third memory array 150 through the wire 252.

It should be noted that in the memory test array 200, there are a plurality of first common conductive pads 12A-12L and a plurality of second common conductive pads 14A-14L at two opposite sides of the second memory array 130. In other words, the second bit lines BL1-BL10 in the second memory array 130 may be equipotentially connected to corresponding first common conductive pads 12A-12L through the wires 220, and further equipotentially connected to the first bit lines BL1-BL10 of the first memory array 110. Moreover, the second word lines WL1-WL10 in the second memory array 130 may be equipotentially connected to corresponding second common conductive pads 14A-14L through the wires 230, and further equipotentially connected to the third word lines WL1-WL10 of the third memory array 150.

The concept of such a shared conductive pad may be extended and is not limited to the memory test arrays 100 and 200 shown in FIGS. 2 and 4. In detail, the common conductive pad may be disposed between two adjacent memory arrays to equipotentially connect their bit lines, or to equipotentially connect their word lines.

Figure 5:
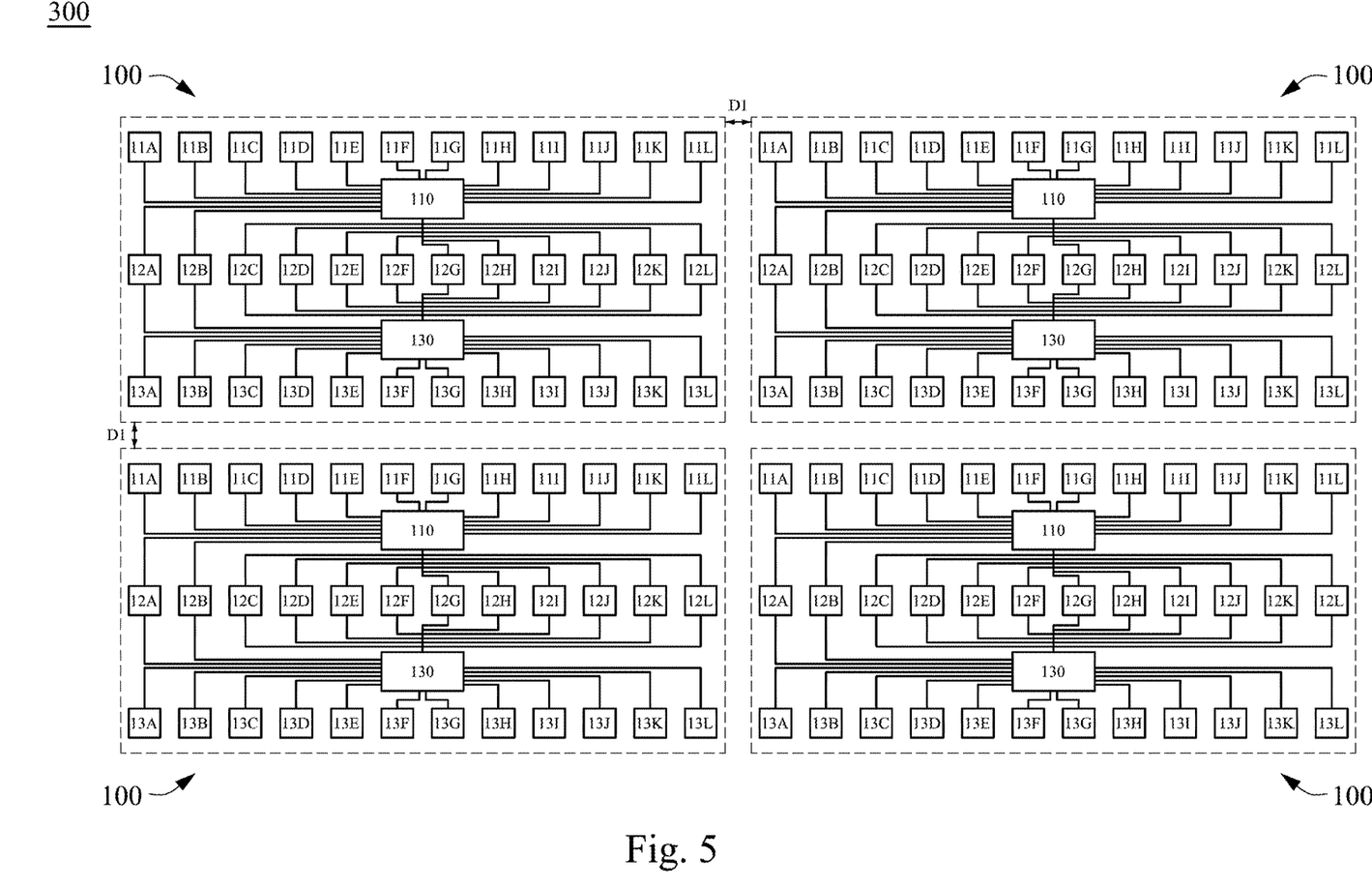
FIG. 5 is a top view of a memory test chip according to some embodiments of the present disclosure.

FIG. 5 is a top view of a memory test chip 300 according to some embodiments of the present disclosure. The memory test chip 300 may include a plurality of memory test arrays 100. In some embodiments, there is a distance D1 between two adjacent memory test arrays 100. In certain embodiments, the distance D1 may be in a range of between about 10 and 50 microns, such as 10, 15, 20, 25, 30, 35, 40, 45 or 50 microns. It should be understood that although FIG. 5 only shows four memory test arrays 100, the present disclosure is not limited thereto. A plurality of memory test arrays 100 may be arranged in accordance with the size of the memory test chip 300. In other embodiments, the memory test chip 300 may also include a plurality of memory test arrays 200 as shown in FIG. 4. The area of the memory test chip 300 may be effectively saved by providing common conductive pads between adjacent memory arrays (e.g., the first memory array 110 and the second memory array 130). That is, in the memory test chip 300 with a fixed area, more memory cells may be accommodated for testing.

Another aspect of the present disclosure is to provide a method of testing a memory test array. Referring first to FIG. 2, the test method of the memory test array 100 includes using a probe card including at least two rows of parallel probes, and pressing down the probe card to be in contact with the first conductive pads 11A-11L and the first common conductive pad 12A-12L, and transmitting a first electrical signal to the first conductive pads 11A-11L and the first common conductive pads 12A-12L to test the first memory array 110. Next, the probe card is raised up and then moved, aligned and pressed down to be in contact with the first common conductive pads 12A-12L and the second conductive pads 13A-13L, and a second electrical signal is transmitted to the second conductive pads 13A-13L and the first common conductive pads 12A-12L to test the second memory array 130. In some embodiments, characteristics of each of the first memory array 110 and the second memory array 130 may be tested by the methods described above. For example, the resistance of each of the phase change memory cells 20 in the first memory array 110 and the second memory array 130 is tested.

Please continue to refer to FIG. 2, in other embodiments, the method of testing the memory test array 100 includes using a probe card including at least three rows of parallel probes, and pressing down the probe card to be in contact with the first conductive pads 11A-11L, the first common conductive pads 12A-12L and the second conductive pads 13A-13L. A first electrical signal is controlled and transmitted to the first conductive pads 11A-11L and the first common conductive pads 12A-12L through a test software to test the first memory array 110. After the first memory array 110 is tested, the test software is switched, and a second electrical signal is controlled and transmitted to the second conductive pads 13A-13L and the first common conductive pads 12A-12L through the test software to test the second memory array. 130. Therefore, characteristics of each memory cell in the first memory array 110 and the second memory array 130 may be tested without moving the probe card, thus reducing test time. In some embodiments, a test time of the first electrical signal and a test time of the second electrical signal on a time axis are not overlapped.

Referring to FIG. 4, similarly, in some embodiments, the test method of the memory test array 200 includes using a probe card including at least two rows of parallel probes, and pressing down the probe card to be in contact with the first conductive pads 11A-11L and the first common conductive pads 12A-12L, and transmitting a first electrical signal to the first conductive pads 11A-11L and the first common conductive pads 12A-12L to test the first memory array 110. Next, the probe card is raised up and then moved and pressed down to be in contact with the first common conductive pads 12A-12L and the second common conductive pads 14A-14L, and a second electrical signal is transmitted to the first common conductive pads 12A-12L and the second common conductive pads 14A-14L to test the second memory array 130. Next, the probe card is raised up and then moved and pressed down to be in contact with the second common conductive pads 14A-14L and the third conductive pads 15A-15L, and a third electrical signal is transmitted to the second common conductive pads 14A-14L and the third conductive pads 15A-15L to test the third memory array 150. As such, characteristics of each memory cell in the first memory array 110, the second memory array 130, and the third memory array 150 may be tested. Therefore, when detecting three memory arrays in the memory test array 200, the probe card requires three times of pressing down and two times of rises and shifts.

In other embodiments, the test method of the memory test array 200 includes using a probe card including at least four rows of parallel probes, and pressing down the probe card to be in contact with the first conductive pads 11A-11L, the first common conductive pads 12A-12L, the second common conductive pads 14A-14L, and the third conductive pads 15A-15L, and transmitting a first electrical signal to the first conductive pads 11A-11L and the first common conductive pads 12A-12L through the control of a test software to test the first memory array 110. Next, a second electrical signal is transmitted to the first common conductive pads 12A-12L and the second common conductive pads 14A-14L through the control of the test software to test the second memory array 130. Finally, a third electrical signal is transmitted to the second common conductive pads 14A-14L and the third conductive pads 15A-15L through the control of the test software to test the third memory array 150. Therefore, characteristics of each memory cell in the first memory array 110, the second memory array 130, and the third memory array 150 may be tested without moving the probe card, thus saving the probe card from rising and shifting with two times. In some embodiments, a test time of the first electrical signal, a test time of the second electrical signal, and a test time of the third electrical signal on a time axis are not overlapped.

As described above, according to an embodiment of the present disclosure, a common conductive pad is disposed between adjacent memory arrays to equipotentially connect its bit line or word line. The memory test array having the common conductive pad of the present disclosure can effectively save the area of the memory test chip compared with the existing memory test array. That is, more memory cells may be accommodated in the memory chip for testing. In addition, using the design of the common conductive pad and testing using the probe card can save test time and make the test process more efficient, and can reduce wear of the probe.

The present disclosure has been disclosed in the above embodiments, and is not intended to limit the present disclosure, and the present disclosure may be variously altered or modified without departing from the spirit and scope of the invention. The protective scope is subject to the scope defined by the appended claims.

What is claimed is:

1. A memory test array, comprising:
   a first memory array including a plurality of first bit lines and a plurality of first word lines;
   a second memory array adjacent to the first memory array, the second memory array including a plurality of second bit lines and a plurality of second word lines;
   a plurality of first common conductive pads, each of the first common conductive pads having a first end and a second end, and the first ends and the second ends respectively coupled to the first word lines and the second word lines;
   a plurality of first conductive pads coupled to the first memory array, and the first conductive pads and the first common conductive pads disposed at two opposite sides of the first memory array, wherein the first conductive pads are coupled to the first bit lines; and a plurality of second conductive pads coupled to the second memory array, and the second conductive pads and the first common conductive pads disposed at two opposite sides of the second memory array, wherein the second conductive pads are coupled to the second bit lines.

2. The memory test array of claim 1, wherein the first common conductive pads are disposed between the first memory array and the second memory array.

3. A method of testing a memory test array, comprising: providing the memory test array of claim 1;
using a probe card including at least three rows of parallel probes, the at least three rows of parallel probes respectively in contact with the first conductive pads, the first common conductive pads and the second conductive pads;
controlling and transmitting a first electrical signal to the first conductive pads and the first common conductive pads through a test software to test the first memory array; and
controlling and transmitting a second electrical signal to the first common conductive pads and the second conductive pads through the test software to test the second memory array.

4. The method of testing the memory test array of claim 3, wherein a test time of the first electrical signal and a test time of the second electrical signal on a time axis are not overlapped.

5. A memory test array, comprising:
a first memory array including a plurality of first bit lines and a plurality of first word lines;
a second memory array adjacent to the first memory array, the second memory array including a plurality of second bit lines and a plurality of second word lines;
a third memory array adjacent to the second memory array, the third memory array including a plurality of third bit lines and a plurality of third word lines;
a plurality of first common conductive pads, each of the first common conductive pads having a first end and a second end, and the first ends and the second ends respectively coupled to the first bit lines and the second bit lines, or the first ends and the second ends respectively coupled to the first word lines and the second word lines; and
a plurality of second common conductive pads disposed between the second memory array and the third memory array, wherein each of the second common conductive pads has a first end and a second end, and the first ends and the second ends are respectively coupled to the second bit lines and the third bit lines, or the first ends and the second ends are respectively coupled to the second word lines and the third word lines.

6. The memory test array of claim 5, further comprising:
a plurality of first conductive pads coupled to the first memory array, and the first conductive pads and the first common conductive pads disposed at two opposite sides of the first memory array; and a plurality of third conductive pads coupled to the third memory array, and the third conductive pads and the second common conductive pads disposed at two opposite sides of the third memory array.

7. The memory test array of claim 6, wherein the first conductive pads are coupled to the first word lines, the third conductive pads are coupled to the third bit lines, the first common conductive pads are coupled to the first bit lines and the second bit lines, and the second common conductive pads are coupled to the second word lines and the third word lines.

8. The memory test array of claim 6, wherein the first conductive pads are coupled to the first bit lines, the third conductive pads are coupled to the third word lines, the first common conductive pads are coupled to the first word lines and the second word lines, and the second common conductive pads are coupled to the second bit lines and the third bit lines.

9. A method of testing a memory test array, comprising: providing the memory test array of claim 6;
using a probe card including at least four rows of parallel probes, the at least four rows of parallel probes respectively in contact with the first conductive pads, the first common conductive pads, the second common conductive pads, and the third conductive pads;
controlling and transmitting a first electrical signal to the first conductive pads and the first common conductive pads through a test software to test the first memory array;
controlling and transmitting a second electrical signal to the first common conductive pads and the second common conductive pads through the test software to test the second memory array; and
controlling and transmitting a third electrical signal to the second common conductive pads and the third conductive pads to test the third memory array.

10. The method of testing the memory test array of claim 9, wherein a test time of the first electrical signal, a test time of the second electrical signal, and a test time of the third electrical signal on a time axis are not overlapped.

11. A memory test array, comprising:
a first memory array including a plurality of first bit contact pads and a plurality of first word contact pads, wherein the first bit contact pads are respectively coupled to bit lines of the first memory array, and the first word contact pads are respectively coupled to word lines of the first memory array; and
a second memory array including a plurality of second bit contact pads and a plurality of second word contact pads, wherein the second bit contact pads are respectively coupled to bit lines of the second memory array, and the second word contact pads are respectively coupled to word lines of the second memory array;
wherein the first word contact pads are shared with the second word contact pads, and the shared first word contact pads and the second word contact pads are disposed between the first memory array and the second memory array.

* * * * *